(12) United States Patent
Li et al.

(10) Patent No.: US 9,958,109 B2
(45) Date of Patent: May 1, 2018

(54) FLEXIBLE DISPLAY DEVICE AND SUPPORT DEVICE THEREOF

(71) Applicant: BOE TECHNOLOGY GROUP CO., LTD., Beijing (CN)

(72) Inventors: Zhao Li, Beijing (CN); Xiangfei He, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days. days.

(21) Appl. No.: 15/319,170

(22) PCT Filed: Jan. 27, 2016

(86) PCT No.: PCT/CN2016/072330
§ 371 (c)(1),
(2) Date: Dec. 15, 2016

(87) PCT Pub. No.: WO2017/036086
PCT Pub. Date: Mar. 9, 2017

(65) Prior Publication Data
US 2017/0254470 A1   Sep. 7, 2017

(30) Foreign Application Priority Data

Aug. 31, 2015  (CN) .......................... 2015 1 0548266

(51) Int. Cl.
*H05K 7/02* (2006.01)
*H05K 7/04* (2006.01)
(Continued)

(52) U.S. Cl.
CPC ....... *F16M 11/2042* (2013.01); *H05K 5/0017* (2013.01); *H05K 5/0217* (2013.01)

(58) Field of Classification Search
CPC . F16M 11/2042; H05K 5/0017; H05K 5/0217
(Continued)

(56) References Cited

U.S. PATENT DOCUMENTS 3,546,961 A * 12/1970 Marton ................... B63C 11/26
                                                                74/502.5
6,104,443 A *  8/2000 Adcock .................. F16M 11/08
                                                                248/188.7
(Continued)

FOREIGN PATENT DOCUMENTS

CN      101952873 A      1/2011
CN      104050882 A      9/2014
(Continued)

OTHER PUBLICATIONS

Written Opinion and International Search Report for PCT/CN2016/072330, English Translation of Written OpinionAttached to Original Document, Completed by the Chinese Patent Office, Dated Apr. 28, 2016, All together 15 Pages.
(Continued)

*Primary Examiner* — Hung S Bui
(74) *Attorney, Agent, or Firm* — Brooks Kushman P.C.

(57) ABSTRACT

The present disclosure provides flexible display device and a support device thereof. The support device includes a skeleton chain which includes a plurality of connected skeleton units. Each skeleton unit includes a head portion and a tail portion joined to the head portion. The head portion has a first rotary surface. The first rotary surface is a cylindrical curved surface or a spherical surface. The tail portion includes a cavity which has a second rotary surface. A radius of the first rotary surface is larger than that of the second rotary surface of the adjacent skeleton unit. The second rotary surface enwraps a part of the first rotary surface of the adjacent skeleton unit such that the head portion of the adjacent skeleton unit engages with the cavity of the tail portion and is rotatable with respect to the cavity of the tail portion.

13 Claims, 3 Drawing Sheets

(51) Int. Cl.
*F16M 11/20* (2006.01)
*H05K 5/00* (2006.01)
*H05K 5/02* (2006.01)

(58) Field of Classification Search
USPC .................................................. 361/809, 810
See application file for complete search history.

(56) References Cited

U.S. PATENT DOCUMENTS

| | | | | |
|---|---|---|---|---|
| 6,648,376 | B2* | 11/2003 | Christianson | E03C 1/06 |
| | | | | 138/120 |
| 7,035,092 | B2* | 4/2006 | Hillman | F16M 11/10 |
| | | | | 285/184 |
| 7,218,510 | B2* | 5/2007 | Hillman | F16M 11/10 |
| | | | | 248/160 |
| 7,533,906 | B2* | 5/2009 | Luettgen | H01R 35/00 |
| | | | | 285/146.1 |
| 8,197,149 | B2* | 6/2012 | Darrow | F16M 11/041 |
| | | | | 248/168 |
| 9,756,757 | B2* | 9/2017 | Park | H05K 7/16 |
| 2011/0043976 | A1* | 2/2011 | Visser | G09F 9/00 |
| | | | | 361/679.01 |
| 2015/0059969 | A1 | 3/2015 | Han | |

FOREIGN PATENT DOCUMENTS

| | | |
|---|---|---|
| CN | 204516278 U | 7/2015 |
| CN | 105185231 A | 12/2015 |
| JP | 2000338891 A | 12/2000 |

OTHER PUBLICATIONS

Chinese Office Action for Chinese Application No. 201510548266. 4, English translation Attached to Original Document, Completed by the Chinese Patent Office, dated May 9, 2016, All together 8 Pages.

* cited by examiner

FLEXIBLE DISPLAY DEVICE AND SUPPORT DEVICE THEREOF

CROSS-REFERENCE TO RELATED APPLICATIONS

This application is the U.S. national phase of PCT Application No. PCT/CN2016/072330 filed on Jan. 27, 2016, which claims priority to Chinese Patent Application No. 201510548266.4 filed on Aug. 31, 2015, the disclosures of which are incorporated in their entirety by reference herein.

TECHNICAL FIELD

The present disclosure relates to the field of display devices, and in particular to a flexible display device and a support device thereof.

BACKGROUND

With development of display techniques, flexible display devices are currently merging into people's life. The flexible display devices are characterized in foldability. However, a user often desires a shape of a flexible display device to be kept in a certain state in the process of using the flexible display device, and to be folded when not using the flexible display device. Current flexible display techniques cannot meet requirements that a flexible display screen is completed folded up or has a very small curvature radius. However, the user may tend to bend or fold up the flexible display device to an extent that the curvature radius of a portion of the flexible display screen is too small, or even the flexible display screen is completed folded up, thus damaging the flexible display screen.

SUMMARY

In view of the above, the present disclosure provides a flexible display device and a support device thereof, which can prevent the flexible display device from being damaged due to over-bending.

In order to achieve the above object, the present disclosure provides a support device for a flexible display device. The support device includes a skeleton chain, which includes a plurality of connected skeleton units. Each of the skeleton units includes a head portion and a tail portion joined to the head portion. The head portion has a first rotary surface, and the first rotary surface is a cylindrical curved surface or a spherical surface. The tail portion includes a cavity, the cavity has a second rotary surface, and a radius of the second rotary surface is smaller than a radius of the first rotary surface of the adjacent skeleton unit. The second rotary surface enwraps a portion of the first rotary surface of the adjacent skeleton unit such that the head portion of the adjacent skeleton unit is engaged with the cavity of the tail portion and is rotatable with respect to the cavity of the tail portion.

Optionally, both the first rotary surface and the second rotary surface are cylindrical curved surfaces, and in each of the skeleton units, the head portion has two major-arc shaped first lateral surface arranged in parallel with each other, the first rotary surface extends along edges of the first lateral surfaces and is joined to the two first lateral surfaces; in each of the skeleton units, the tail portion has two major-arc shaped second lateral surfaces arranged in parallel with each other, and the second lateral surfaces are parallel to the first lateral surfaces, and the second rotary surface is in the tail portion and between the two second lateral surfaces: and radians of edges of the second lateral surfaces are smaller than radians of edges of the first lateral surfaces of the adjacent skeleton unit.

Optionally, a difference between a radius of the second rotary surface and a radius of the first rotary surface of the adjacent skeleton unit is smaller than one percent of the radius of the first rotary surface of the adjacent skeleton unit.

Optionally, the head portion and the tail portion of the skeleton unit are joined together by a bar-shaped structure.

Optionally, the bar-shaped structure is one of a first bar-shaped structure and a second bar-shaped structure, the first bar-shaped structure is a straight bar and the second bar-shaped structure is a straight bar having a circular-arc shaped indentation, and the indentation is at an edge of a connection portion between the head portion and the second bar-shaped structure.

Optionally, the support device further includes a soft sheath for wrapping the skeleton chain.

Optionally, the skeleton chain includes a first skeleton chain and a second skeleton chain: and the support device further includes a first supporting bar and a second supporting bar arranged in parallel with each other; a first end of the first supporting bar and a first end of the second supporting bar are connected by the first skeleton chain, and a second end of the first supporting bar and a second end of the second supporting bar are connected by the second skeleton chain, and the first skeleton chain is parallel to the second skeleton chain.

Further, a flexible display device is provided in the present disclosure, which includes a flexible display screen and the support device provided in any embodiment of the present disclosure, and the support device is attached to the flexible display screen.

Optionally, the support device includes a soft sheath for wrapping the skeleton chain, and the flexible display screen is attached to the skeleton chain by the soft sheath.

Optionally, a slot is arranged in the soft sheath, and an edge of the flexible display screen is in the slot.

Optionally, the skeleton chain includes a first skeleton chain and a second skeleton chain; and the support device further includes a first supporting bar and a second supporting bar arranged in parallel with each other; a first end of the first supporting bar and a first end of the second supporting bar are connected by the first skeleton chain, and a second end of the first supporting bar and a second end of the second supporting bar are connected by the second skeleton chain, and the first skeleton chain is parallel to the second skeleton chain.

Edges of the flexible display screen are attached to the first supporting bar, the second supporting bar, the first skeleton chain and the second skeleton chain, respectively.

Further, the present disclosure further provides a support device for a flexible display device including at least one skeleton chain. The skeleton chain includes a first skeleton unit and a second skeleton unit. The first skeleton unit includes a first head portion and a first tail portion joined to the first head portion. The first head portion has a first rotary surface; the first rotary surface is a cylindrical curved surface or a spherical surface. The first tail portion includes a first cavity, and the first cavity has a second rotary surface. The second skeleton unit includes a second head portion and a second tail portion joined to the second head portion. The second head portion has a first rotary surface, and the first rotary surface of the second head portion is a cylindrical curved surface or a spherical surface. The second tail portion includes a second cavity, and the second cavity has the second rotary surface. A radius of the second rotary surface of the second cavity is smaller than a radius of the first rotary surface of the first head portion, and the second rotary surface of the second cavity warps a portion of the first rotary surface of the first head in such an interference fit manner that the second tail portion is rotatable with respect to the first head portion.

Optionally, each of the first rotary surface of the first head portion, the first rotary surface of the second head portion, the second rotary surface of the first cavity and the second rotary surface of the second cavity is a cylindrical curved surface. The first head portion has two major-arc shaped first lateral surfaces arranged in parallel with each other, the first rotary surface of the first head portion extends along edges of the first lateral surfaces of the first head portion, and is joined to the two first lateral surfaces of the first head portion; the first tail portion has two major-arc shaped second lateral surfaces arranged in parallel with each other, the second lateral surfaces of the first tail portion are parallel to the first lateral surfaces of the first head portion; the second head portion has two major-arc shaped first lateral surfaces arranged in parallel with each other, the first rotary surface of the second head portion extends along edges of the first lateral surfaces of the second head portion, and is joined to the two first lateral surfaces of the second head portion; the second tail portion has two major-arc shaped second lateral surfaces arranged in parallel with each other, the second lateral surfaces of the second tail portion are parallel to the first lateral surfaces of the second head portion; and radians of the edges of the second lateral surfaces of the second tail portion are smaller than radians of the edges of the first lateral surfaces of the first head portion.

Optionally, a difference between a radius of the second rotary surface of the second cavity and a radius of the first rotary surface of the first head portion is smaller than one percent of the radius of the first rotary surface of the first head portion.

Optionally, the first skeleton unit further includes a first bar-shaped structure, the first bar-shaped structure joins the first head portion to the first tail portion; the second skeleton unit further includes a second bar-shaped structure, the second bar-shaped structure joins the second head portion to the second tail portion; the first bar-shaped structure includes a straight bar having a circular-arc shaped indentation, the indentation is at an edge of a connection portion between the first head portion and the first bar-shaped structure, and is in a path along which the second tail portion rotates with respect to the first head portion.

Optionally, the second bar-shaped structure includes a straight bar having a circular-arc shaped indentation, and the indentation of the second bar-shaped structure is at an edge of a connection portion between the second head portion and the second bar-shaped structure.

From the above, it may be seen that the support device may support a flexible display screen of the flexible display device in a proper manner, and may restrict a bending extent of the flexible display device, and prevent the flexible display device from being damaged due to over-bending. Meanwhile, because the radius of the first rotary surface is larger than that of the second rotary surface, an interference fit exists between the head portion of one skeleton unit and the tail portion of the adjacent skeleton unit and a relative rotation between two adjacent skeleton units is inactive, i.e., the skeleton chain does not rotate until the user exerts a certain force. Thus, the support device may shape the flexible display device in the process of bending the flexible display device, thereby satisfying different requirements of different users.

The flexible display device provided by the present disclosure is provided with the support device provided in any embodiment of the present disclosure, and the bending extent of the flexible display device may be restricted by the support device. Thus, the flexible display device may be protected from being damaged due to over-bending and the flexible display device may be shaped according to requirements of users.

DETAILED DESCRIPTION

To make technical problems to be solved, technical solutions, and advantages of the present disclosure more clear, details will be described hereinafter in combination with the drawings and embodiments.

Figure 1:
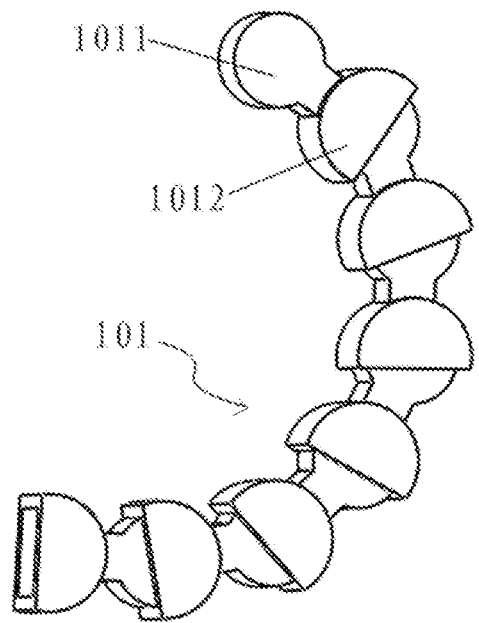
FIG. 1 is a schematic diagram of a skeleton chain of a support device for a flexible display device according to at least some embodiments of the present disclosure.

Firstly, the present disclosure provides a support device for a flexible display device, a structure of which is shown in FIG. 1. The support device includes a skeleton chain 101 formed by connecting a plurality of skeleton units. Each of the skeleton units includes a head portion 1011 and a tail portion 1012 joined to the head portion 1011. The head portion 1011 has a first rotary surface which may be a cylindrical curved surface or a spherical surface. The tail portion 1012 includes a cavity for accommodating the head portion of an adjacent skeleton unit. The cavity has a second rotary surface matching with the first rotary surface of the adjacent skeleton unit. A radius of the first rotary surface is larger than that of the second rotary surface, and the second rotary surface enwraps a portion of the first rotary surface of the adjacent skeleton unit, such that the head portion 1011 of one skeleton unit engages with the cavity of the tail portion 1012 of the adjacent skeleton unit, and is rotatable with respect to the cavity of the tail portion 1012 of the adjacent skeleton unit.

In related arts, flexible display devices are merging into people's life. Thus, how to shape the flexible display devices to satisfy requirements of the user becomes an important issue.

The support device for the flexible display device provided by the present disclosure facilitates folding of the flexible display device by means of the skeleton chain, and adjacent skeleton units are connected by enwrapping the first rotary surface with the adjacent second rotary surface. When the tail portion of one skeleton unit rotates with respect to the head portion of the adjacent skeleton unit to a certain extent, the tail portion of the one skeleton unit may touch a joined portion between the head portion and the tail portion of the adjacent skeleton unit, and thus a rotation range is restricted. When one flexible display device is supported by using the support device provided by the present disclosure, an extent of bending of the flexible display device may be changed with an extent of bending of the support device. Thus, the extent of bending of the flexible display device may be controlled. When the flexible display device is bent to a certain extent, the support device cannot be bent any more, and thus the flexible display device cannot be further bent. Meanwhile, because the radius of the first rotary surface is larger than that of the second rotary surface, an interference fit exists between the head portion of one skeleton unit and the tail portion of the adjacent skeleton unit and a relative rotation between adjacent skeleton units is inactive, i.e., the skeleton chain does not rotate until the user exerts a certain force. Thus, the support device of one embodiment of the present disclosure may shape the flexible display device in the process of bending the flexible display device, and thus the support device can satisfy different requirements of different users.

In the embodiments of the present disclosure, the cylindrical curved surface may include a complete cylindrical curved surface, or a partial cylindrical curved surface, i.e., the cylindrical curved surface may refer to a part of a lateral surface of a cylinder. The spherical surface may include a complete spherical surface, or a partial spherical surface, i.e., the spherical surface refers to a part of an entire surface of a sphere.

Figure 5:
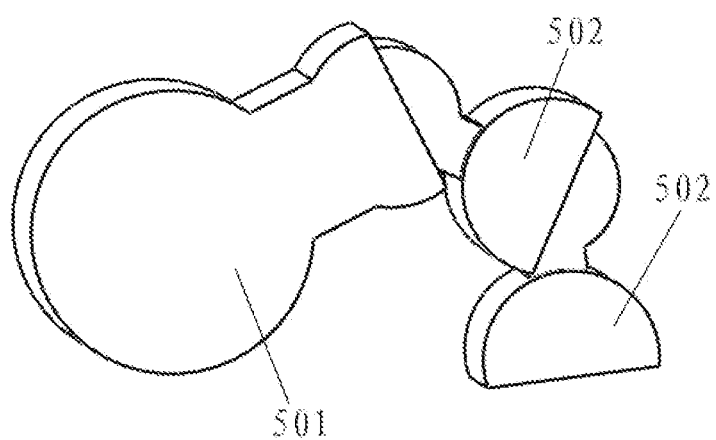
FIG. 5 is a schematic diagram of a skeleton chain according to at least some embodiments of the present disclosure.

In some embodiments of the present disclosure, sizes of the head portions of the skeleton units may be the same or different, and sizes of the tail portions of the skeleton units may be the same or different, as long as the tail portion of one skeleton unit may match and engage with the head portion of one skeleton unit adjacent to the tail portion of the one skeleton unit. As shown in FIG. 5, a radius of a head portion of a first skeleton unit 501 is much larger than that of a head portion of another skeleton unit 502. In the embodiment shown in FIG. 1, the sizes of the head portions of the skeleton units are substantially the same, and the sizes of the tail portions of the skeleton units are also substantially the same. When the sizes of the head portions of the skeleton units are different and the sizes of the tail portions of the skeleton units are different, bending extents at different positions of the skeleton chain may be different. When different maximum bending extents are required at different positions of the flexible display device, the skeleton chain shown in FIG. 5 may be adopted.

Figure 2A:
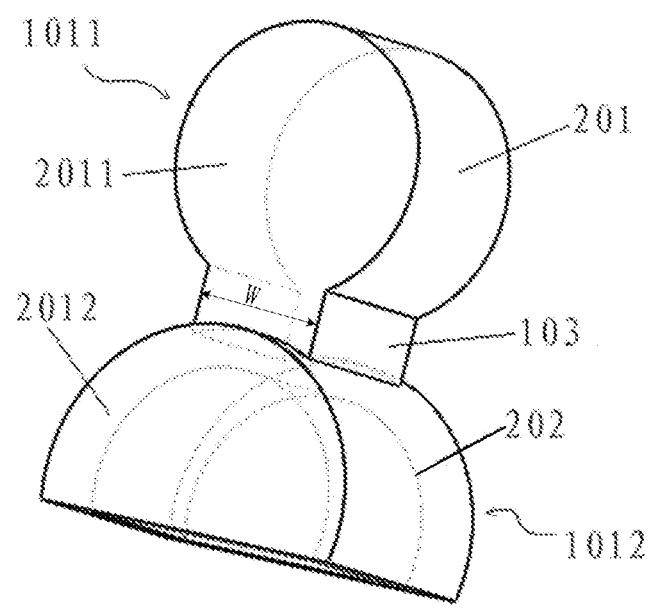
FIG. 2A is a schematic diagram of a skeleton unit of a support device for a flexible display device according to at least some embodiments of the present disclosure.

In some embodiments of the present disclosure, referring to FIG. 2A, the first rotary surface 201 and the second rotary surface 202 are cylindrical curved surfaces, respectively. The head portion 1011 has two major-arc first lateral surfaces 2011 arranged in parallel with each other. The first rotary surface 201 extends along arc-shaped edges of the first lateral surfaces 2011 and is joined to the two first lateral surfaces 2011. The tail portion 1012 has two major-arc second lateral surfaces 2012 arranged in parallel with each other. The second lateral surfaces 2012 are parallel to the first lateral surfaces 2011. The second rotary surface 202 is in the tail portion 1012 and between the two second lateral surfaces 2012. Radians of edges of the first lateral surfaces 2011 are larger than those of edges of the second lateral surfaces 2012.

When the first rotary surface and the second rotary surface are spherical surfaces, the skeleton chain may be rotatable in a plurality of directions. When one skeleton chain is used as the support device of one flexible display device, if the skeleton chain is rotated in a plurality of directions under condition that one skeleton chain is attached to one flexible display screen, it may cause warping of the flexible display screen in a plane of the flexible display screen, thus damaging the flexible display screen. Thus, in some embodiments, both the first rotary surface and the second rotary surface are cylindrical surfaces.

The radians of the edges of the first lateral surfaces are larger than those of the edges of the second lateral surfaces, and the interference fit may be generated when the second rotary surface enwraps the first rotary surface, such that the head portion of one skeleton unit may engage with the tail portion of one adjacent skeleton portion without disengagement.

The major arc is a type of arc, a radian of which is larger than that of a semi-circle arc.

In some embodiments of the present disclosure, a difference between the radius of the second rotary surface and the radius of the first rotary surface is smaller than one percent of the radius of the first rotary surface.

Intuitively, the radius of the second rotary surface and the radius of the first rotary surface are substantially the same, and the difference between the radiuses are much smaller compared with the size of one skeleton unit, otherwise, if the radius of the second rotary surface is much larger than that of the first rotary surface, the second rotary surface may not rotate with respect to the first rotary surface. After a plurality of times of experiments, it is obtained that in case that the difference between the radius of the second rotary surface and the radius of the first rotary surface is smaller than one percent of the radius of the first rotary surface, the head portion of one skeleton unit and the tail portion of one adjacent skeleton unit is not easily disengaged and the adjacent skeleton units may be rotatable relative to each other.

In some embodiments of the present disclosure, still referring to FIG. 2A, the head portion 1011 and the tail portion 1012 are joined together through a bar-shaped structure 103.

A width W of the bar-shaped structure 103 is smaller than diameters of the first rotary surface 201 and the second rotary surface 202, and may function to stop relative rotation between the head portion 1011 of one skeleton unit and the tail portion 1012 of one adjacent skeleton unit. The bar-shaped structure 103 with a certain width may be fabricated according to an extent to which one flexible display screen may be bent, so as to control a relative rotation angle between two adjacent skeleton units within a range permitted by the flexible display screen.

Figure 2B:
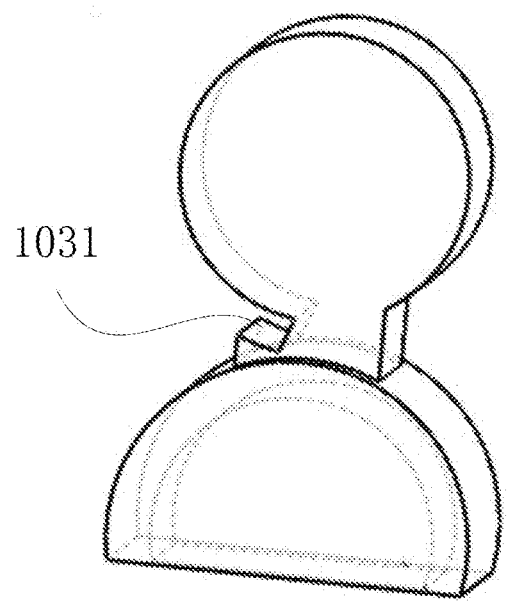
FIG. 2B is a schematic diagram of a skeleton unit of a support device for a flexible display device according to at least some embodiments of the present disclosure.

In some embodiments of the present disclosure, the bar-shaped structure may be in a shape shown in FIG. 2B which is specifically a straight bar having a circular-arc shaped indentation 1031. The indentation 1031 is located at an edge of a connection portion between the head portion and the bar-shaped structure, and is used to receive a part of the tail portion of one adjacent skeleton unit when the tail portion of one adjacent skeleton unit rotates, such that the part of the tail portion of one adjacent skeleton unit is embedded in the indentation 1031.

Figure 3:
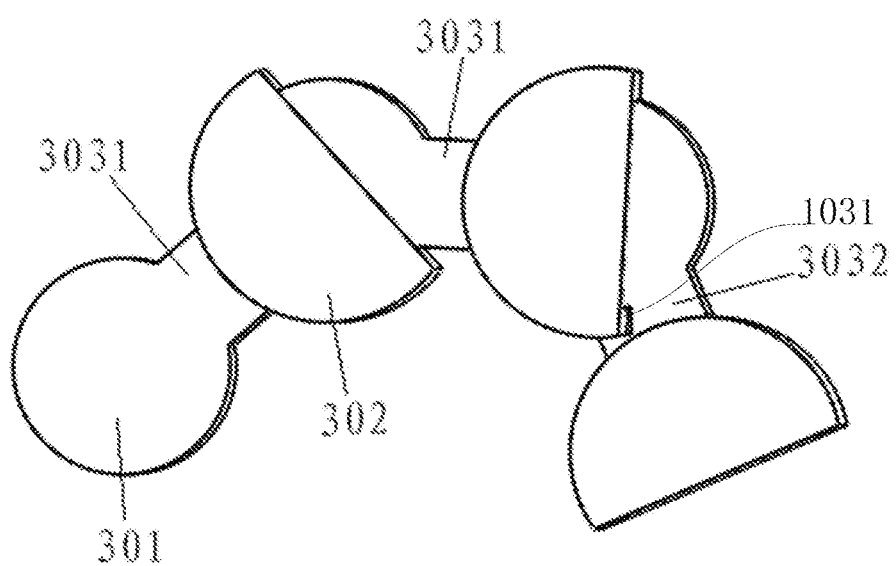
FIG. 3 is a schematic diagram of a skeleton chain according to at least some embodiments of the present disclosure.

As shown in FIG. 3, the bar-shaped structures in the skeleton chain may include a first bar-shaped structure 3031 or a second bar-shaped structure 3032. The first bar-shaped structure 3031 is a straight bar, and the second bar-shaped structure 3032 is a straight bar having the circular-arc shaped indentation 1031. The indentation 1031 is located at an edge of a connection portion between the head portion 301 and the second bar-shaped structure 3032, and is used to receive the part of the tail portion 302 when the tail portion 302 rotates, such that the part of the tail portion 302 is embedded into the indentation 1031.

At a folding line of one flexible display screen, bending degrees of skeleton units at different positions are different. Straight bars or straight bars having indentations of different sizes may be used, in order to cause a portion of the skeleton chain, where one flexible display screen needs to be bent in a relatively large angle range, capable of being bent at a relatively large angle range, as well as in order to cause a portion of the skeleton chain, where the flexible display screen needs to be bent in a relatively small angle range, capable of being bent at a relative small angle range. One skeleton chain may include a plurality of skeleton units having the first bar-shaped structure and a plurality of skeleton units having the second bar-shaped structure.

In some embodiments of the present disclosure, different thickness of the bar-shaped structures may also define different relative rotation angle ranges between adjacent skeleton units. Thinner bar-shaped structures may be adopted at a portion of the skeleton chain where a relatively small rotation angle range is desired; thicker bar-shaped structures may be adopted at a portion of the skeleton chain where a relatively large rotation angle range is desired.

In some embodiments of the present disclosure, the support device further includes a soft sheath for wrapping the skeleton chain.

A material for manufacturing the soft sheath may be one of rubber, fluorubber, Thermoplastic Ployurethanes (TPU) or a mixture thereof. A slot for fixing the flexible display screen may be arranged in the soft sheath, such that edges of the flexible display screen may be inserted into the soft sheath and attached to the soft sheath.

The soft sheath may both function to protect the skeleton chain and improve aesthetic perception of the support device.

Figure 4:
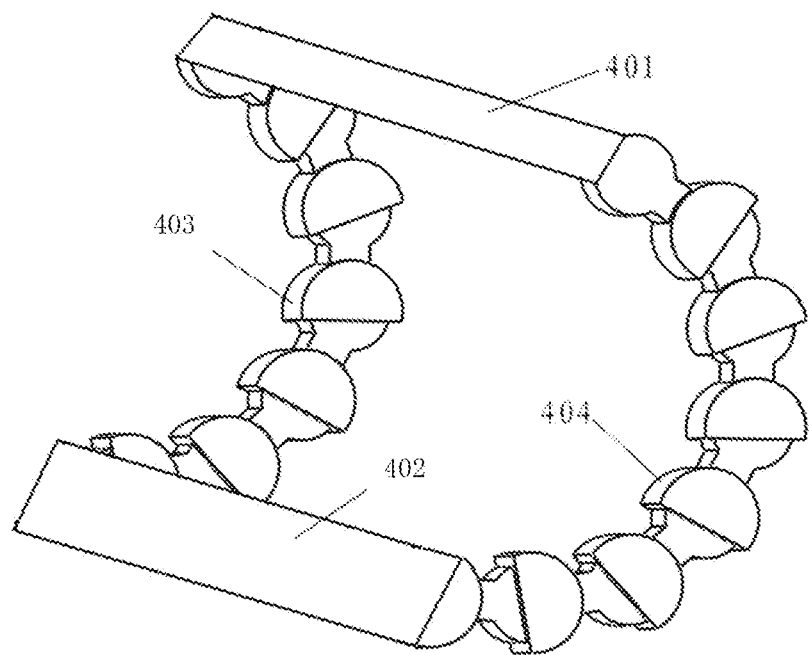
FIG. 4 is a schematic diagram of a support device for a flexible display device according to at least some embodiments of the present disclosure.

In some embodiments of the present disclosure, as shown in FIG. 4, the support device for one flexible display device further includes a first supporting bar 401 and a second supporting bar 402 arranged in parallel. A first end of the first supporting bar 401 and a first end of the second supporting bar 402 are connected by a first skeleton chain 403. A second end of the first supporting bar 401 and a second end of the second supporting bar 402 are connected by a second skeleton chain 404. The first skeleton chain 403 and the second skeleton chain 404 are parallel with each other.

For one flexible display having a relatively large area, one skeleton chain may not protect the flexible display properly. Thus, in the support device provided in the above embodiments, two skeleton chains are provided; the two skeleton chains, the first supporting bar, and the second supporting bar may form a surface, thereby better protecting the flexible display screen having a relatively large area.

The support device for one flexible display device shown in FIG. 4 may be attached on a front side of the flexible display device or a back side of the flexible display device.

In optional embodiments of the present disclosure, the first supporting bar, the second supporting bar, the first skeleton chain, and the second skeleton chain are attached to a rectangular flexible display screen at four sides of the flexible display screen.

Further, a flexible display device is provided in the present disclosure, which includes a flexible display screen and the above support device. The flexible display screen is attached to the skeleton chain of the support device.

In some embodiments of the present disclosure, the support device includes the soft sheath for wrapping the skeleton chain, and the flexible display screen is attached to the skeleton chain by the soft sheath.

In some embodiments of the present disclosure, the support device used for the flexible display screen of the flexible display device is shown in FIG. 4. Edges of the flexible display screen are attached to the first supporting bar 401, the second supporting bar 402, the first skeleton chain 403, and the second skeleton chain 404, respectively.

From the above, it may be seen that the support device for the flexible display device provided in the present disclosure may support a flexible display screen of the flexible display device in a proper manner, and may restrict a bending extent of the flexible display device, and prevent the flexible display from being damaging due to over-bending of the flexible display. Meanwhile, because the radius of the first rotary surface is larger than that of the second rotary surface, an interference fit exists between the head portion of one skeleton unit and the tail portion of one adjacent skeleton unit and the relative rotation between two adjacent skeleton units is inactive, i.e., the skeleton chain does not rotate until the user exerts a certain force. Thus, the support device provided in the present disclosure may shape the flexible display device in the process of bending the flexible display device, thereby satisfying different requirements of different users.

The flexible display device provided by the present disclosure is provided with the support device provided in any of the embodiments of the present disclosure, and the bending extent of the flexible display device can be restricted by the support device, thereby protecting the flexible display device from being damaged due to over-bending. In addition, the flexible display device may be shaped according to requirements of users due to the presence of the support device.

It should be understood that the embodiments described in the present disclosure are only used to illustrate and explain the present disclosure, not to limit the present disclosure. The embodiments and features in the embodiments in the present disclosure may be combined under condition that no conflicts would occur.

Obviously, those skilled in the art may modify and change the present disclosure without departing from spirits and scopes of the present disclosure. If such modification and changes to the present disclosure fall into the scope of claims of the present disclosure or equivalent thereof, it is intended that the modification and changes are included in the present disclosure.

The invention claimed is:

1. A support device for a flexible display device, comprising:
   a skeleton chain which includes a plurality of connected skeleton units;
   wherein each of the skeleton units comprises a head portion and a tail portion joined to the head portion; the head portion has a first rotary surface, the first rotary surface is a cylindrical curved surface or a spherical surface; the tail portion comprises a cavity, and the cavity has a second rotary surface; a radius of the second rotary surface of one of the skeleton units is smaller than a radius of the first rotary surface of the skeleton unit adjacent to the one of the skeleton units; the second rotary surface of the one of the skeleton units enwraps a part of the first rotary surface of the skeleton unit adjacent to the one of the skeleton units such that the head portion of the skeleton unit adjacent to the one of the skeleton units is engaged with the cavity of the one of the skeleton units and is rotatable with respect to the cavity of the one of the skeleton units;

wherein both the first rotary surface and the second rotary surface are cylindrical curved surfaces;

in each of the skeleton units, the head portion has two major-arc shaped first lateral surfaces which are parallel to each other, and the first rotary surface extends along edges of the first lateral surfaces and is joined to the two first lateral surfaces;

in each of the skeleton units, the tail portion has two major-arc shaped second lateral surfaces which are parallel to each other, the second lateral surfaces are parallel to the first lateral surfaces, the second rotary surface is in the tail portion and between the two second lateral surfaces; and radians of edges of the second lateral surfaces of the one of the skeleton units are smaller than radians of edges of the first lateral surfaces of the skeleton unit adjacent to the one of the skeleton units.

2. The support device according to claim 1, wherein a difference between a radius of the second rotary surface of the one of the skeleton units and a radius of the first rotary surface of the skeleton unit adjacent to the one of the skeleton units is smaller than one percent of the radius of the first rotary surface of the skeleton unit adjacent to the one of the skeleton units.

3. The support device according to claim 1, wherein in each of the skeleton units, the head portion and the tail portion are joined together by a bar-shaped structure.

4. The support device according to claim 3, wherein the bar-shaped structure is one of a first bar-shaped structure and a second bar-shaped structure; the first bar-shaped structure is a straight bar; the second bar-shaped structure is a straight bar having a circular-arc shaped indentation, and the indentation is at an edge of a connection portion between the head portion and the second bar-shaped structure.

5. The support device according to claim 1, further comprising a soft sheath; wherein the soft sheath wraps the skeleton chain.

6. The support device according to claim 1, wherein the skeleton chain comprise a first skeleton chain and a second skeleton chain; and the support device further comprises a first supporting bar and a second supporting bar which is parallel to the first supporting bar;

wherein a first end of the first supporting bar and a first end of the second supporting bar are connected by the first skeleton chain; a second end of the first supporting bar and a second end of the second supporting bar is connected by the second skeleton chain; and the first skeleton chain is parallel to the second skeleton chain.

7. A flexible display, comprising:
a flexible display screen; and
a support device including a skeleton chain which includes a plurality of connected skeleton units; each of the skeleton units comprises a head portion and a tail portion joined to the head portion; the head portion has a first rotary surface, the first rotary surface is a cylindrical curved surface or a spherical surface; the tail portion comprises a cavity, and the cavity has a second rotary surface; a radius of the second rotary surface of one of the skeleton units is smaller than a radius of the first rotary surface of the skeleton unit adjacent to the one of the skeleton units; the second rotary surface of the one of the skeleton units enwraps a part of the first rotary surface of the skeleton unit adjacent to the one of the skeleton units such that the head portion of the skeleton unit adjacent to the one of the skeleton units is engaged with the cavity of the one of the skeleton units and is rotatable with respect to the cavity of the one of the skeleton units;

wherein the support device further comprises a soft sheath for wrapping the skeleton chain; and the flexible display screen is attached to the skeleton chain by the soft sheath; and wherein the flexible display screen is attached to the skeleton chain of the support device.

8. The flexible display according to claim 7, wherein the soft sheath comprises a slot; and an edge of the flexible display screen is in the slot.

9. The flexible display according to claim 7, wherein the skeleton chain comprise a first skeleton chain and a second skeleton chain; and the support device further comprises a first supporting bar and a second supporting bar which is parallel to the first supporting bar; a first end of the first supporting bar and a first end of the second supporting bar are connected by the first skeleton chain; a second end of the first supporting bar and a second end of the second supporting bar is connected by the second skeleton chain; the first skeleton chain is parallel to the second skeleton chain;

edges of the flexible display screen are attached to the first supporting bar, the second supporting bar, the first skeleton chain and the second skeleton chain, respectively.

10. A support device for a flexible display device, comprising:
at least one skeleton chain, the skeleton chain comprising a first skeleton unit and a second skeleton unit;
wherein the first skeleton unit comprises a first head portion and a first tail portion joined to the first head portion; the first head portion has a first rotary surface, the first rotary surface is a cylindrical curved surface or a spherical surface; the first tail portion comprises a first cavity, and the first cavity has a second rotary surface;
wherein the second skeleton unit comprises a second head portion and a second tail portion joined to the second head portion; the second head portion has a first rotary surface, the first rotary surface of the second head portion is a cylindrical curved surface or a spherical surface; the second tail portion comprises a second cavity, and the second cavity has a second rotary surface; and
wherein a radius of the second rotary surface of the second cavity is smaller than a radius of the first rotary surface of the first head portion; the second rotary surface of the second cavity warps a portion of the first rotary surface of the first head in such a interference fit manner that the second tail portion is rotatable with respect to the first head portion; and
wherein the first skeleton unit further comprises a first bar-shaped structure, the first bar-shaped structure joins the first head portion to the first tail portion;
the second skeleton unit further comprises a second bar-shaped structure, the second bar-shaped structure joins the second head portion to the second tail portion;
the first bar-shaped structure comprises a straight bar having a circular-arc shaped indentation; the indentation is at an edge of a connection portion between the first head portion and the first bar-shaped structure, and is in a path along which the second tail portion rotates with respect to the first head portion.

11. The support device according to claim 10, wherein each of the first rotary surface of the first head portion, the first rotary surface of second head portion, the second rotary surface of the first cavity and the second rotary surface of the second cavity is a cylindrical curved surface;

the first head portion has two major-arc shaped first lateral surfaces which are parallel to each other; the first rotary surface of the first head portion extends along edges of the first lateral surfaces of the first head portion, and is joined to the two first lateral surfaces of the first head portion;

the first tail portion has two major-arc shaped second lateral surfaces which are parallel to each other, the second lateral surfaces of the first tail portion are parallel to the first lateral surfaces of the first head portion;

the second head portion has two major-arc shaped first lateral surfaces which are parallel to each other; the first rotary surface of the second head portion extends along edges of the first lateral surfaces of the second head portion, and is joined to the two first lateral surfaces of the second head portion;

the second tail portion has two major-arc shaped second lateral surfaces which are parallel to each other; the second lateral surfaces of the second tail portion are parallel to the first lateral surfaces of the second head portion; and radians of edges of the second lateral surfaces of the second tail portion are smaller than radians of edges of the first lateral surfaces of the first head portion.

12. The support device according to claim 11, wherein a difference between a radius of the second rotary surface of the second cavity and a radius of the first rotary surface of the first head portion is smaller than one percent of the radius of the first rotary surface of the first head portion.

13. The support device according to claim 10, wherein the second bar-shaped structure comprises a straight bar having a circular-arc shaped indentation; the indentation of the second bar-shaped structure is at an edge of a connection portion between the second head portion and the second bar-shaped structure.

* * * * *